United States Patent [19]
Li et al.

[11] Patent Number: 6,099,596
[45] Date of Patent: *Aug. 8, 2000

[54] WAFER OUT-OF-POCKET DETECTION TOOL

[75] Inventors: Shih-Hung Li, Sunnyvale; Curtis Vass, Pleasanton, both of Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/899,631

[22] Filed: Jul. 23, 1997

[51] Int. Cl.⁷ .............................. H01L 21/00; H01L 21/64
[52] U.S. Cl. ............................................................ 29/25.01
[58] Field of Search .................................. 29/25.01; 438/7, 438/8, 9, 16, 908, 975, FOR 101, FOR 141, FOR 142, FOR 435

[56] References Cited

U.S. PATENT DOCUMENTS

| | | |
|---|---|---|
| 3,740,563 | 6/1973 | Reichard . |
| 4,282,184 | 8/1981 | Fiegl et al. . |
| 4,697,089 | 9/1987 | Drage . |
| 4,724,322 | 2/1988 | Knowles et al. . |
| 4,819,167 | 4/1989 | Cheng et al. . |
| 4,911,597 | 3/1990 | Maydan et al. . |
| 5,191,200 | 3/1993 | van der Werf et al. ............ 250/201.4 |
| 5,194,743 | 3/1993 | Aoyama et al. . |
| 5,194,744 | 3/1993 | Aoki et al. ................................ 250/548 |
| 5,227,862 | 7/1993 | Oshida et al. . |
| 5,333,413 | 8/1994 | Hashimoto ........................... 51/165.75 |
| 5,461,237 | 10/1995 | Wakamoto et al. .................... 250/548 |
| 5,497,419 | 3/1996 | Hill ............................................. 380/9 |
| 5,561,416 | 10/1996 | Marshall et al. ........................ 340/456 |
| 5,563,798 | 10/1996 | Berken et al. . |
| 5,700,127 | 12/1997 | Harada et al. . |
| 5,803,972 | 9/1998 | Sato et al. ............................... 118/712 |

OTHER PUBLICATIONS

PCT International Search Report, International Application No. PCT/US 98/15519, filed Jul. 22, 1998, mailed Nov. 24, 1998 (4 pages).

Patent Abstracts of Japan, vol. 015, No. 046 (E–1029), Feb. 4, 1991 & JP 02 280313 A (Hitachi Ltd.), Nov. 16, 1990, see English language abstract.

Database WPI, Section EI, Week 9535, Derwent Publications Ltd., London, GB; Class S02, AN 95–267298, XP002084089, & JP 07 169823 A (Kokusai Denki KK), Jul. 4, 1995, see English language abstract.

Primary Examiner—David E. Graybill
Attorney, Agent, or Firm—Blakely Sokoloff Taylor & Zafman

[57] ABSTRACT

An apparatus for monitoring the inclination of a wafer residing within a pocket of a semiconductor processing chamber susceptor. The apparatus of the present invention includes a laser beam source that is positioned to direct a laser beam onto the top surface of a wafer that has been positioned within a susceptor pocket. A laser receiver is positioned to detect the laser beam after it has been reflected off the surface of the wafer. The laser receiver emits an output signal to a visual or audible indicator that indicates whether or not the wafer is properly positioned within the pocket of the susceptor.

18 Claims, 7 Drawing Sheets

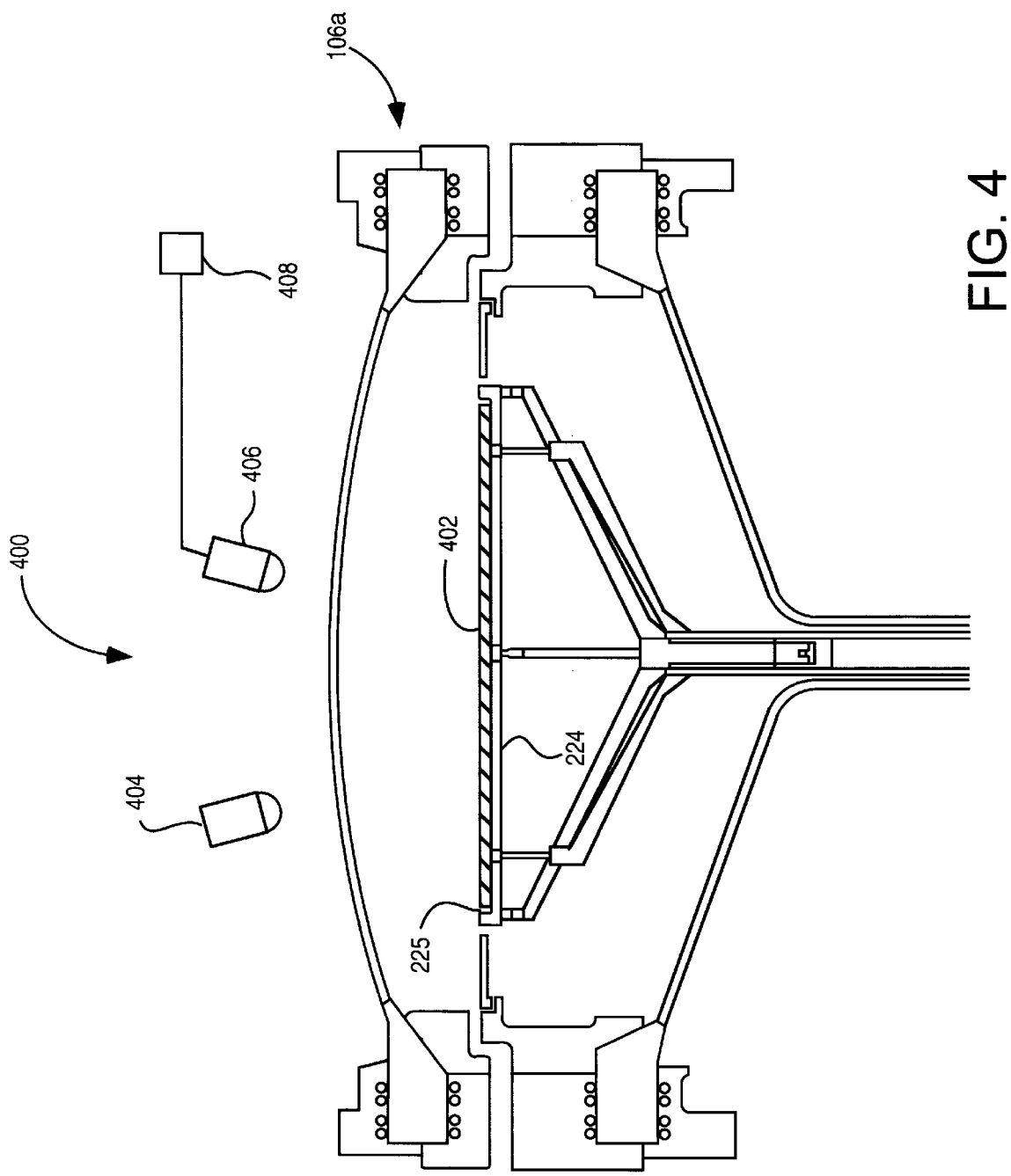

WAFER OUT-OF-POCKET DETECTION TOOL

FIELD OF THE INVENTION

The present invention relates generally to semiconductor processing and particularly to a tool for detecting the position of a wafer in a semiconductor processing chamber.

BACKGROUND OF THE INVENTION

Deposition of a film on the surface of a semiconductor wafer is a common step in semiconductor processing. The process of depositing layers on a semiconductor wafer (or substrate) usually involves placing the substrate within a processing chamber and holding the wafer within a stream of a reactant gas flowing across the surface of a wafer. Usually, heat is applied to drive the chemical reaction of the gases in the chamber and to heat the surface of the wafer on which the film is deposited. The processing chamber is typically heated by external lamps which pass infra-red radiation into the processing chamber through a quartz window that is transparent to the infra-red radiation.

Referring now to FIG. 1, there is shown a multiple-chamber integrated process system 100 including an enclosed main frame or housing 102 having sidewalls that define an enclosed vacuum transfer chamber 104.

A number of individual processing chambers 106a–f are mounted one each on an associated sidewall of the transfer chamber 104. Two load lock cassette elevators 108a and 108b are adapted for vertically stacking a multiplicity of cassettes which in turn hold wafers 110 horizontally. The load lock cassette elevator assemblies 108a and 108b selectively position each cassette directly opposite and aligned with a transfer chamber entrance slit or opening 112a and 112b, respectively. Each cassette holds multiple wafers. Wafers 110 are held within the cassette by a set of support structures 111 having a diameter that is slightly larger than the diameter of the wafers being housed.

Processing chambers 106a–f and the associated main frame side walls also have communicating slits 114a–f, respectively, which are similar to the load lock entrance slits 112a and 112b. Doors or slit valves (not shown) are provided for sealing the access slits.

A robotic wafer transfer system 120 is mounted within transfer chamber 104 for transferring wafers 110 between load locks 108a and 108b and the individual processing chambers 106a–f. Robot assembly 120 includes a blade 122 and a driver (not shown) that imparts both rotational and reciprocating movement to blade 122 for affecting the desired cassette-to-chamber, chamber-to-chamber and chamber-to-cassette wafer transfer. The reciprocating movement (straight line extension and retraction) is indicated by arrow 130, while the pivotal or rotational movement is indicated by arrow 140.

FIG. 2 illustrates a cross-sectional view of an exemplary semiconductor processing chamber, such as processing chamber 106a depicted in FIG. 1. Processing chamber 106a includes an inner chamber 202 for facilitating the flow of a process gas over the surface of a wafer. The housing includes a baseplate 204 having a gas inlet port 206 and a gas exhaust port 208. An upper clamp ring 210 and a lower clamp ring 212 act to hold a quartz cover member 214 and a quartz lower member 216 in place, respectively. Process gas is injected into chamber 202 through gas inlet port 206 which is connected to a gas source. Residual process gas and various waste products are continuously removed from the interior of chamber 202 through exhaust port 208. Arrows F indicate the typical flow path of a reactant gas passing through the chamber.

Wafers are placed into and removed from chamber 202 by the robotic wafer handling system 120 through an opening 203 formed in the side wall of the chamber.

A susceptor 224 holds the wafer in position during the semiconductor layer deposition process. As shown in FIG. 2, susceptor 224 includes a pocket 225 that is defined by at least one annular or planar bottom surface 226 and a cylindrical side wall 227. The depth of pocket 225 is generally chosen so that the top surface of the wafer being processed is approximately level with the top surface of the susceptor. Susceptor support 229 is coupled to susceptor 224 for rotating the wafer during the semiconductor fabrication process. Susceptor 224 also includes a plurality of through holes 240 for receiving at least three pins 242. Loading position pins 242 are attached to a support shaft 244 that provides vertical movement to raise and lower pins 242. Pins 242 are used to raise a wafer above susceptor surface 226 while the wafer is being loaded or unloaded into the chamber. Raising of the wafer prevents the robot blade from scraping or otherwise damaging the susceptor surface during the wafer loading or unloading procedure.

Heating lamps 228 and 230 provide infra-red radiant heat into the chamber through window portion 214 and quartz lower member 216 which are transparent to infra-red radiation.

In deposition processes, it is desirable to maximize wafer throughput while depositing film layers that have uniform thickness. With the increasing miniaturization of electronic circuits, there is a need to more accurately control the thickness of the deposition layers during semiconductor wafer processing. Among other requirements, in order to obtain uniform deposition layer thicknesses, it is important that the angular orientation of the wafer with that of the gas flow be essentially equal at all points along the wafer surface during the deposition process.

As discussed above, a robotic wafer handling system is often used to position a wafer within the pocket of a semiconductor processing chamber susceptor. As shown in FIGS. 3A and 3B, in some instances a wafer 300 is improperly placed on the susceptor 302. As a result, a portion of the wafer will reside outside of the susceptor pocket 304 causing the wafer to be out of alignment with the reactant gas flow stream. Currently, there is no method for detecting whether a wafer has been properly placed within the susceptor pocket.

The slant or tilt of the out-of-pocket wafer will result in an uneven film deposition across the surface of the wafer and a non-uniform resistivity. If the film deposition thickness or resistivity of a wafer is found to be non-uniform during post-process testing, that wafer and every wafer residing within the same cassette is discarded. This adversely affects throughput and results in higher processing costs.

Therefore, what is needed is a method and an apparatus for accurately determining the angular position of a wafer within a semiconductor processing chamber.

SUMMARY OF THE INVENTION

An apparatus and method for monitoring the inclination of a wafer residing within a pocket of a semiconductor processing chamber susceptor is disclosed. The apparatus of the present invention includes a light beam transmitter that is positioned to direct a light beam, such as a laser beam, onto the top surface of a wafer that has been positioned within a susceptor pocket. A light beam receiver is positioned to detect the light beam after it has been reflected off the surface of the wafer. The light beam receiver emits an output signal to a visual or audible indicator that indicates whether or not the wafer is properly positioned within the pocket of the susceptor.

BRIEF DESCRIPTION OF THE DRAWINGS

The present invention is illustrated by way of example and is not limited by the figures of the accompanying drawings, in which like references indicate similar elements, and in which:

FIG. 4 illustrates the processing chamber of FIG. 2 having a wafer out-of-pocket detection system of the present invention.

DETAILED DESCRIPTION

An apparatus and method for monitoring the inclination of a wafer residing within a pocket of a semiconductor processing chamber susceptor is disclosed. In the following description, numerous specific details are set forth such as material types, dimensions, processing steps, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention.

As previously discussed, in order to obtain uniform deposition layer thicknesses across the surface of a wafer, it is important that the angular orientation of the wafer with that of the gas flow be essentially equal at all points along the wafer surface. The need to more accurately maintain the proper angular orientation of the wafer has become increasingly more important the increasing miniaturization of electronic circuits and the larger wafers being processed. In accordance with the present invention, a wafer out-of-pocket detection device is provided that monitors the inclination of a wafer that is resting upon a susceptor within a semiconductor processing chamber.

Figure 1:
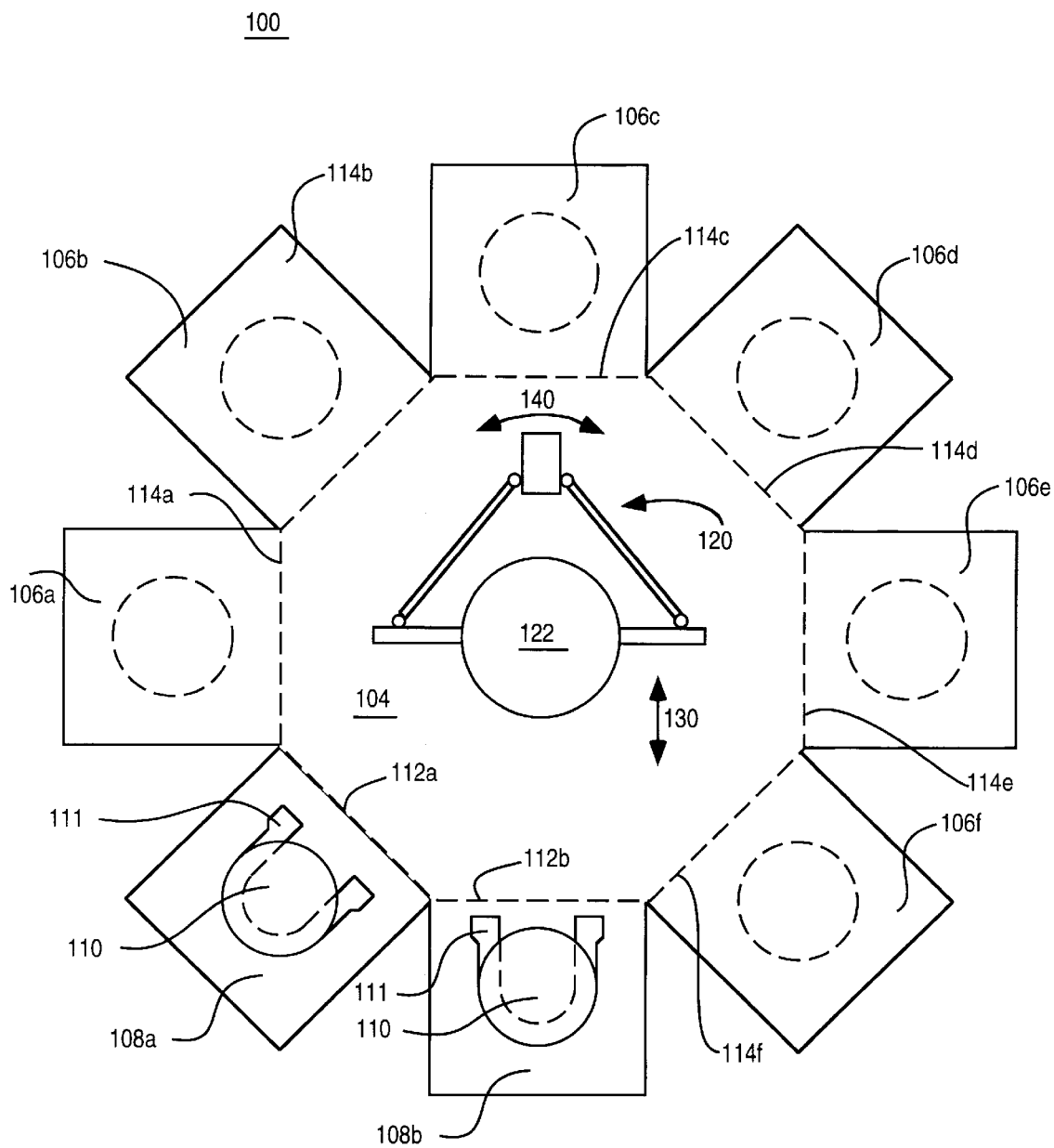
FIG. 1 illustrates a top view of a multiple chamber semiconductor processing unit.
Figure 2:
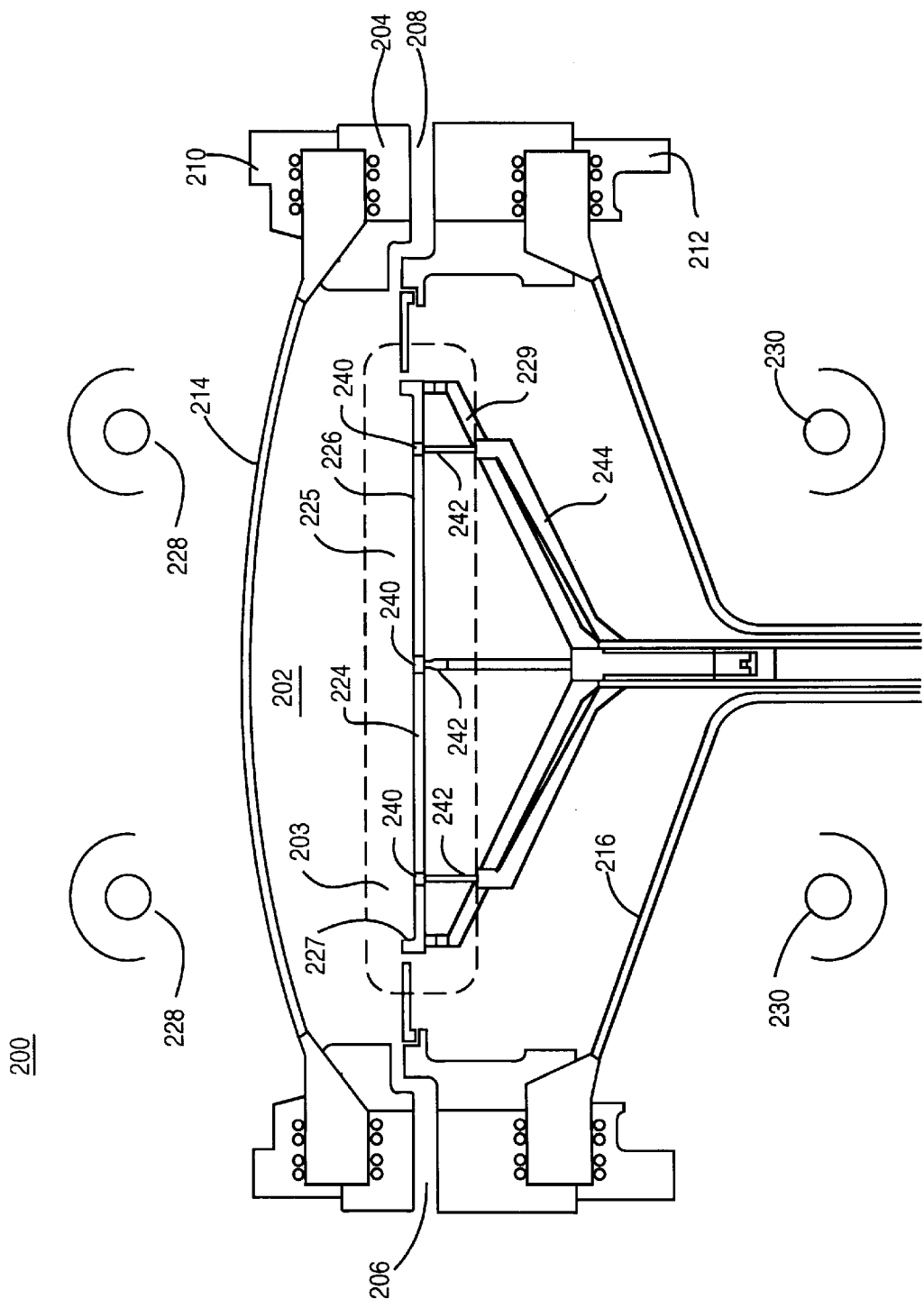
FIG. 2 illustrates a typical cross-sectional view of a semiconductor processing chamber shown in FIG. 1.
Figure 3A:
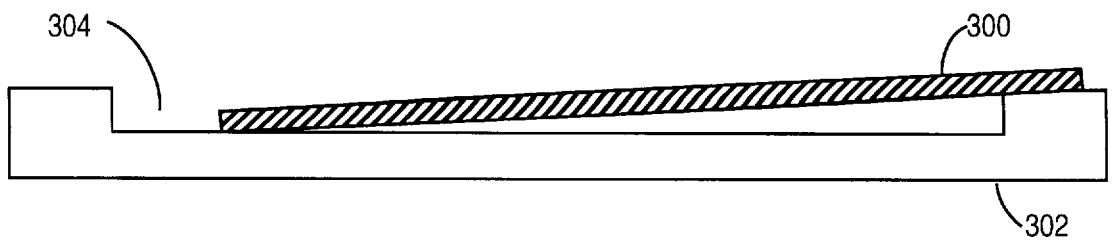
FIG. 3A illustrates a side view of a wafer that is improperly placed within a pocket of a susceptor.
Figure 3B:
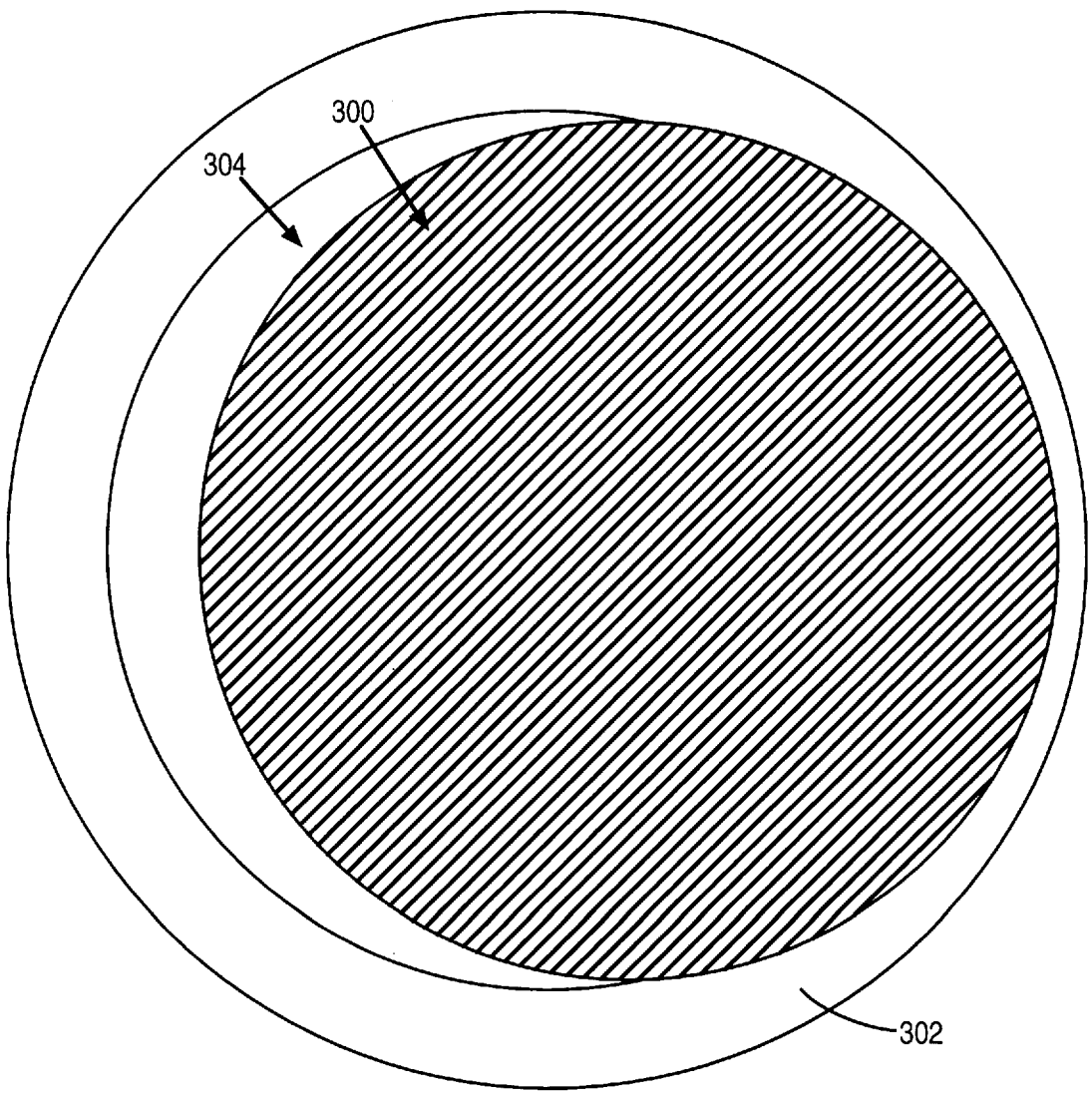
FIG. 3B illustrates a top view of the wafer and susceptor shown in FIG. 3A.

FIG. 4 illustrates the processing chamber 106a of FIG. 2 having a wafer out-of-pocket detection system 400 configured to monitor the inclination of a wafer 402 residing within the pocket 225 of susceptor 224. Detection system 400 includes a light transmitter 404, a light receiver 406 and an indicating device 408 that is configured to receive an output signal from light receiver 406. Hence, in accordance with the present invention a light beam is directed onto the top surface wafer 402 by light transmitter 404. Light receiver 406 is positioned to detect the light beam after it is reflected from the surface of the wafer. Transmitter 404 and receiver 406 are positioned relative to one another such that the reflected light beam will be received by light receiver 406 when the wafer is properly positioned within the pocket of the susceptor. Receiver 406 generates an output signal that is received by a visual and/or audible indicator 408. For example, if a wafer out-of-pocket condition is detected, indicator 408 provides a visual and/or audible alarm to alert a technician that a problem exist.

Figure 5A:
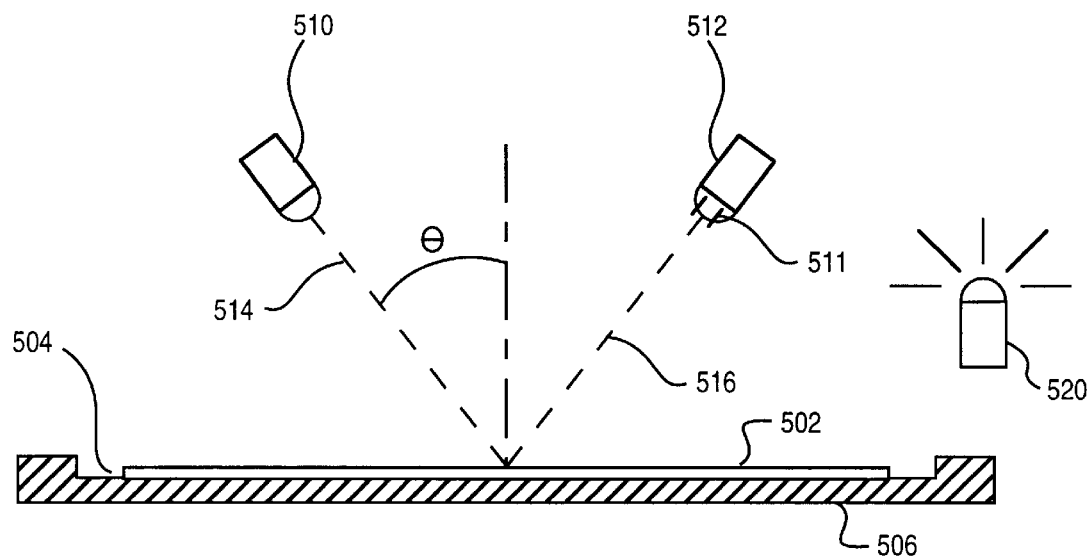
FIGS. 5A and 5B illustrate a side view of a wafer out-of-pocket detection tool in accordance with one embodiment of the present invention.
Figure 5B:
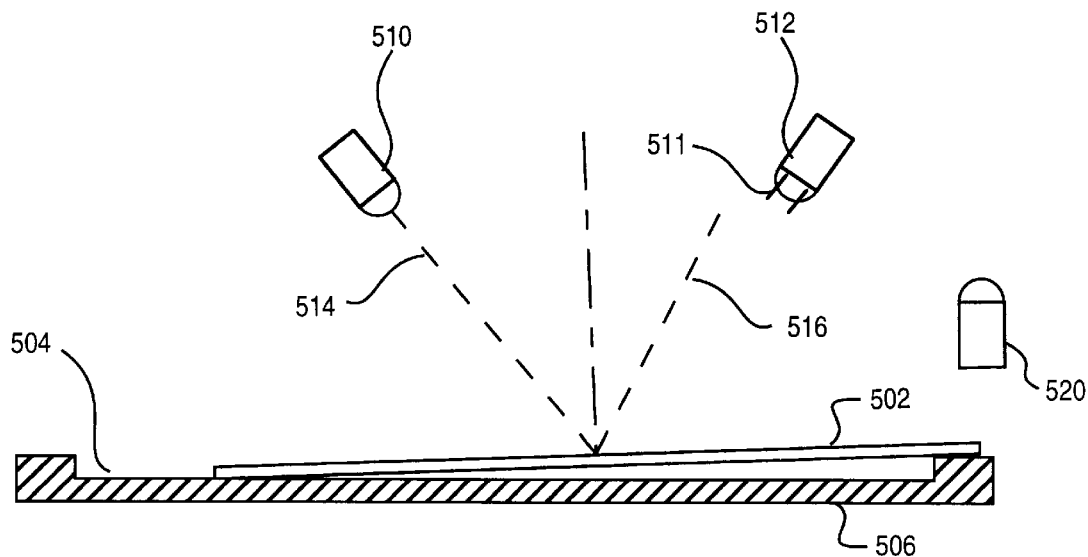

FIGS. 5A and 5B illustrate how the out-of pocket detection system of the present invention works. In FIG. 5A a wafer 502 is shown properly positioned within a pocket 504 of a susceptor 506. A light transmitter 510 is positioned to direct a light beam 514 onto the surface of wafer 502. The incident angle of light beam 514 is indicated by the angle theta. Light receiver 512 is positioned to receive the reflected light beam 516 through a window 511 when the surface of the wafer is in a horizontal position. As shown in FIG. 5A, when the wafer 502 is properly positioned within the susceptor pocket, the reflected light beam 516 is received by light receiver 512 through window 511. A wafer position indicator 520 is configured to receive a state signal from light receiver 512. In the embodiment of FIG. 5A, indicator 520 comprises a lamp that is illuminated when the wafer is properly positioned within the susceptor pocket.

FIG. 5B shows wafer 502 being improperly positioned within the pocket 504 of susceptor 506. As a result of the wafer being improperly positioned within the pocket, the surface of the wafer is slightly tilted. As shown, the tilted orientation of wafer 502 causes the reflected light beam 516 to be directed away from the window 511 of receiver 512. As a result, the state signal of light receiver 512 is off, thus indicating a wafer out-of-pocket condition exists.

In one embodiment, light transmitter 510 and light receiver 512 include a laser transmitter and a laser receiver, respectively. In such an embodiment, the light beam comprises a high energy laser beam. Since the lamps used to heat the processing chamber emit infra-red radiation, it is important that the light beam possess a wavelength outside the infrared spectrum. Preferably, the wavelength of the light beam is maintained below 630 nanometers. In one embodiment, the wavelength of light beam 514 is maintained in the range of 500 to 600 nanometers.

In one embodiment, light transmitter 510 is positioned such that the incident angle, theta, of light beam 514 is approximately 40 degrees. It is appreciated the angular orientation of transmitter 510 and receiver 512 may be increased or decreased depending upon the particular system requirements. If a more sensitive sensing device is desired, the angle between transmitter 510 and receiver 512 may be widened.

Figure 6:
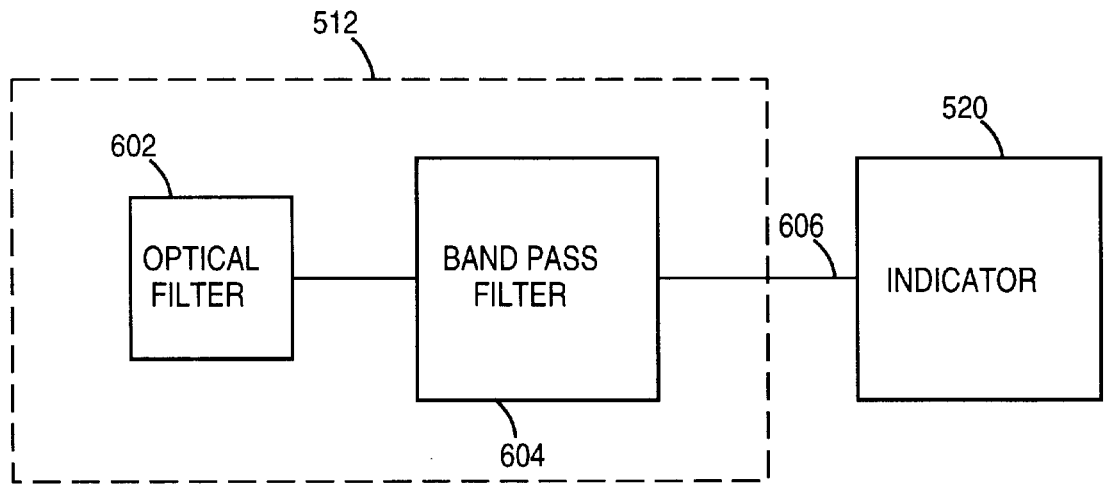
FIG. 6 illustrates a block diagram of one embodiment of the present invention.

Turning now to FIG. 6, a block diagram of receiver 512 and indicator 520 is shown. Receiver 512 includes an optical filter/optical notch 602 and a band pass/low pass filter 604. Optical filter 602 typically comprises a physical lens inherent in the receiver window 511. Optical filter 602 only permits light within a particular bandwidth to be sensed by the receiver. For example, optical filter 602 typically only transmits light having a frequency equal to that of light transmitter 510. Band pass filter 604 is provided to filter out electrical noise, such as noise from the 110V AC voltage power source. Receiver 512 produces an output signal 606 that is received by an indicator 520. As previously discussed, indicator 520 may include a visual indicator, such as a lamp. Alternatively, indicator 520 may include an audible indicator such as an alarm horn.

Figure 7:
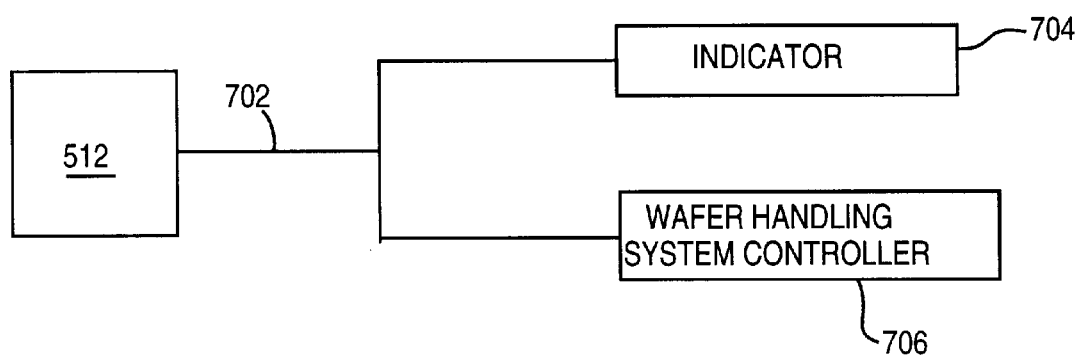
FIG. 7 illustrates a block diagram of a wafer processing assembly in accordance with one embodiment of the present invention.

FIG. 7 illustrates another embodiment of the present invention wherein receiver 512 has an output 702 that is electrically coupled to a wafer position indicator 704 and to the controller 706 of the automated wafer handling system that is used to position the wafer within the pocket of the susceptor. In this manner, when a wafer out-of-pocket condition is detected, signal 702 may be used to initiate logic within controller 706 to cause the wafer handling system to retrieve and to attempt to reposition the wafer into the susceptor pocket.

Figure 8:
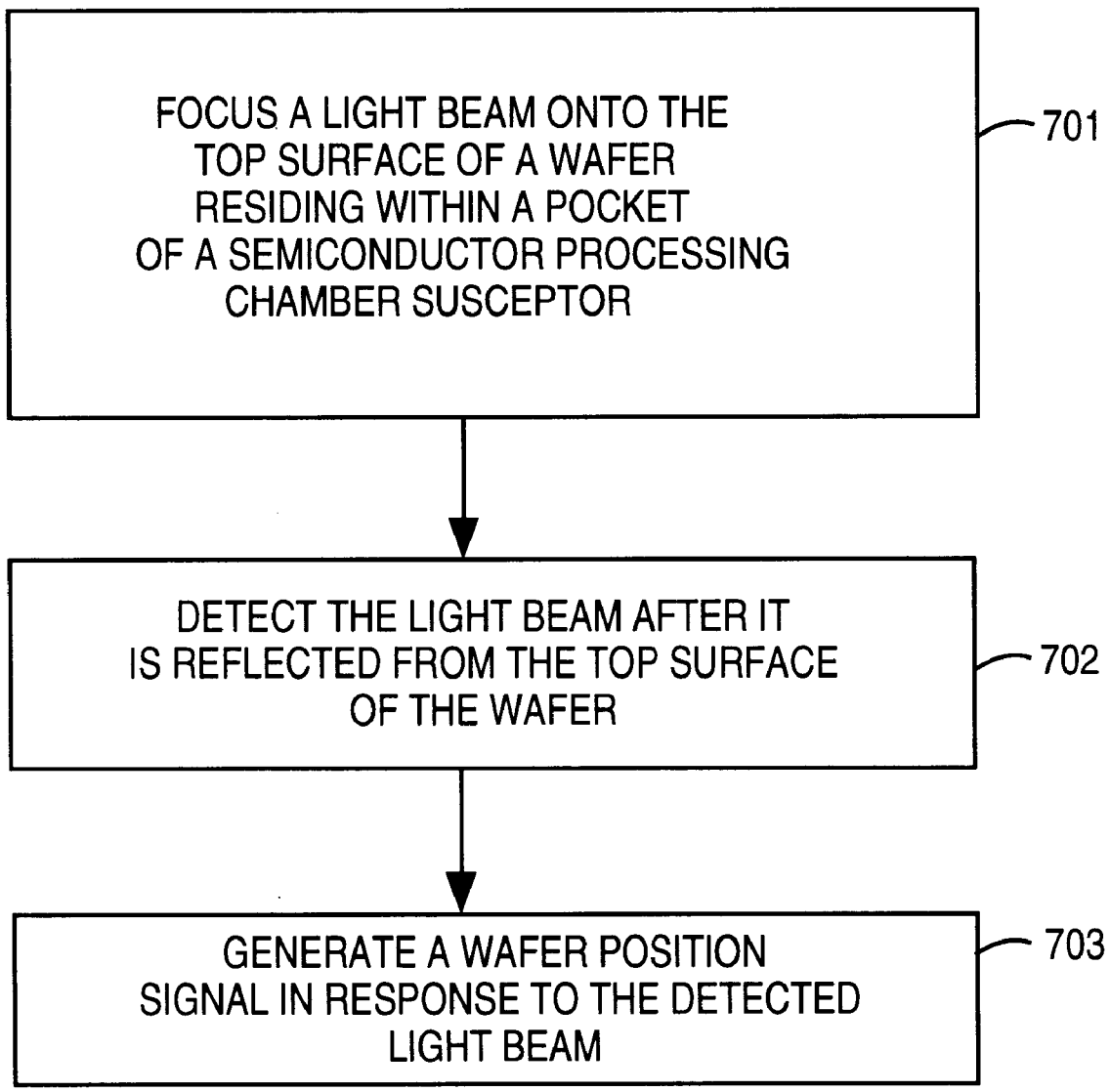
FIG. 8 is a flow chart of a method of monitoring the inclination of a wafer located within a semiconductor processing chamber in accordance with one embodiment of the present invention.

FIG. 8 is a flow chart representing a method of detecting the inclination of a wafer residing within the pocket of a semiconductor processing chamber susceptor. In step 701 a light beam is focused onto the top surface of the wafer. This step is typically accomplished by focusing the light beam through a quartz window of the processing chamber. In step 702, the light beam is detected after it is reflected from the surface of the wafer by a light receiver that provides an output signal indicative of a wafer's postion to an indicator device (step 703).

A key advantage wafer out-of-pocket tool of the present invention is that the position of a wafer within a processing chamber may be monitored during the processing sequence. The ability to individually detect the position of each wafer as it is being processed permits readjustments to be made during the processing sequence. In addition, the individual wafer detection scheme of the present invention results in greater yield since individual wafers can be discarded as a result a single wafer out-of-pocket condition rather than the entire cassette lot.

It is important to note that the present invention is not limited to any specific type of processing chamber or wafer handling system, nor is it limited to one type of susceptor design.

It is appreciated that the relative dimensions, geometric shapes, materials and process techniques set forth within the specification are exemplary of the disclosed embodiments only. Whereas many alterations and modifications to the present invention will no doubt become apparent to a person ordinarily skilled in the art having read the foregoing description, it is to be understood that the particular embodiments shown and described by way of illustration are in no way intended to be limiting. Therefore, reference to the details of the illustrated diagrams is not intended to limit the scope of the claims which themselves recite only those features regarded as essential to the invention.

What is claimed is:

1. A semiconductor wafer processing assembly comprising:

a high temperature processing chamber having a susceptor, said susceptor having a pocket for holding a wafer;

an automated wafer handling system for positioning said wafer into said pocket of said susceptor, said wafer handling system being controlled by a controller;

a laser source positioned to direct a laser beam onto the top surface of said wafer during high temperature processing of said wafer in said processing chamber, said laser beam having a wavelength shorter than that of infrared radiation;

a laser receiver for directly detecting said laser beam after said laser beam is reflected from said top surface of said wafer when said wafer is positioned substantially horizontally within said pocket; and a wafer inclination indicator coupled to said light sensor.

2. The assembly of claim 1 wherein said laser beam has a wavelength within the range of 500 to 600 nanometers.

3. The assembly of claim 1 wherein said wafer inclination indicator comprises a visual display.

4. The assembly of claim 1 wherein said wafer inclination indicator comprises an audible alarm.

5. The assembly of claim 1 wherein said laser receiver produces an output signal to said wafer handling system controller.

6. The assembly of claim 1 wherein said laser source and said laser receiver are located outside said processing chamber.

7. The assembly of claim 1 further comprising heat lamps that provide infrared radiant heat to said chamber and wherein said laser receiver detects said laser beam when said chamber is heated by said heat lamps.

8. A semiconductor wafer processing assembly comprising:

a processing chamber having a susceptor, said susceptor having a pocket for holding a wafer;

heat lamps that provide infrared radiant heat to said chamber;

a light source positioned to direct a light beam onto the top surface of said wafer;

a light sensor for directly detecting said light beam after said light beam is reflected from said top surface of said wafer when said wafer is positioned substantially horizontally within said pocket and when said heat lamps provide infrared radiant heat; and a wafer inclination indicator coupled to said light sensor.

9. The assembly of claim 8 wherein said light beam has a wavelength shorter than that of infrared radiation.

10. The assembly of claim 8 wherein said light beam has a wavelength of less than 630 nanometers.

11. The assembly of claim 8 wherein said light beam has a wavelength within the range of 500 to 600 nanometers.

12. The assembly of claim 8 wherein said wafer inclination indicator comprises a visual display.

13. The assembly of claim 8 wherein said wafer inclination indicator comprises an audible alarm.

14. The assembly of claim 8 wherein said light sensor produces an output signal to said wafer handling system controller.

15. The assembly of claim 8 wherein said light source and said light sensor are located outside said processing chamber.

16. The apparatus of claim 8 wherein said light source is a laser source and said light beam is a laser beam.

17. The apparatus of claim 8 wherein said heat lamps heat said chamber above about 600 degrees Celsius.

18. The apparatus of claim 17 wherein said light sensor detects said light beam when said chamber is heated above about 600 degrees Celsius.

* * * * *